United States Patent

Oshima et al.

[11] Patent Number: 5,907,213
[45] Date of Patent: May 25, 1999

[54] PIEZOELECTRIC CABLE AND WIRE HARNESS USING THE SAME

[75] Inventors: Ryuichi Oshima; Takaki Naito, both of Tokyo, Japan; Kyung Tae Park, Berwyn, Pa.

[73] Assignee: Measurement Specialties, Inc., Fairfield, N.J.

[21] Appl. No.: 08/960,652

[22] Filed: Oct. 30, 1997

[30] Foreign Application Priority Data

Oct. 30, 1996 [JP] Japan .................................. 8-303927

[51] Int. Cl.[6] .............................................. H01L 41/087
[52] U.S. Cl. ............................................................ 310/328
[58] Field of Search .............................................. 310/328

[56] References Cited

U.S. PATENT DOCUMENTS

| | | | |
|---|---|---|---|
| 2,834,943 | 5/1958 | Grisdale et al. | 310/328 |
| 3,820,208 | 6/1974 | Baldy | 310/328 |
| 3,831,162 | 8/1974 | Armstrong | 340/261 |
| 4,629,925 | 12/1986 | Booth et al. | 310/330 |
| 4,695,988 | 9/1987 | Banno | 310/800 |
| 5,275,885 | 1/1994 | Ogura | 428/383 |
| 5,432,498 | 7/1995 | Zilbershtein et al. | 340/566 |
| 5,486,820 | 1/1996 | Chatigny et al. | 340/933 |

FOREIGN PATENT DOCUMENTS

| | | | |
|---|---|---|---|
| 0 534 532 A1 | 9/1993 | European Pat. Off. | G01V 3/02 |
| 2 012 519 | 7/1979 | United Kingdom | H04R 17/00 |
| 2 256 111 | 11/1992 | United Kingdom | H04R 17/00 |

OTHER PUBLICATIONS

United Kingdom Search Report, dated Feb. 9, 1998.

*Primary Examiner*—Thomas M. Dougherty
*Attorney, Agent, or Firm*—Arthur L. Plevy

[57] ABSTRACT

The present invention provides a low-cost piezoelectric cable and wire harness using the same, which offer a high connection reliability without picking up interference signals in areas where the cable acts as a sensor. Coaxial piezoelectric cable 10 has a piezoelectric material layer 14 disposed between a core conductor 12 and an outer conductor 16. Piezoelectric material layer 14 is polarized and shows piezoelectric properties in a region 20 which extends along a window frame 2 of an automobile, but is not polarized, and therefore shows no piezoelectric properties, in a region 22 in which it is not desired that the cable act as a sensor. Accordingly, there is no pick-up of false signals in the region 22.

5 Claims, 2 Drawing Sheets

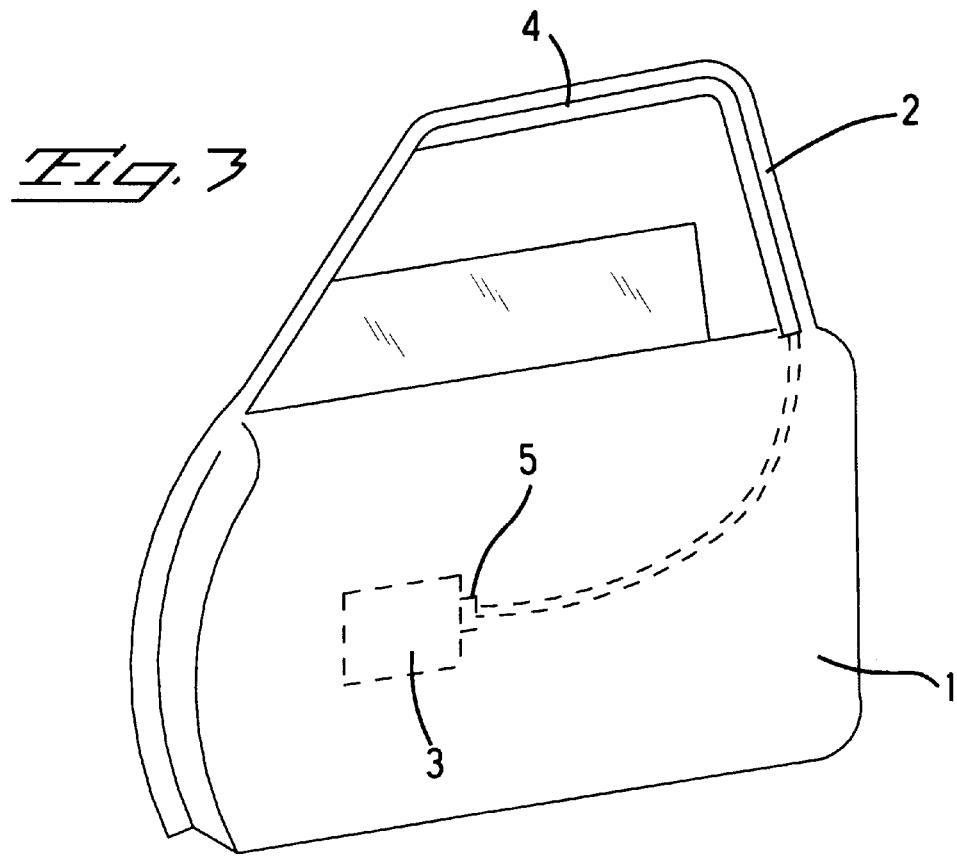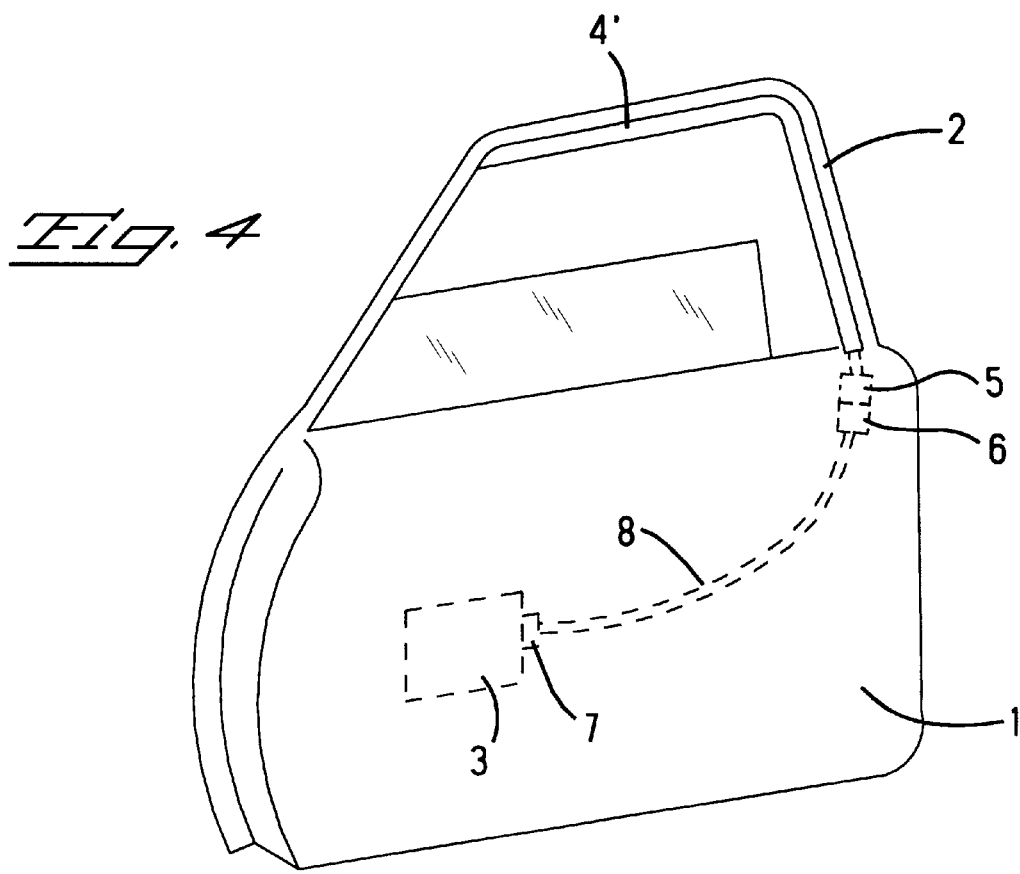

PIEZOELECTRIC CABLE AND WIRE HARNESS USING THE SAME

FIELD OF THE INVENTION

The present invention relates to a piezoelectric cable and a wire harness using the same, and more specifically concerns a piezoelectric cable which is suitable for use in pressure sensors attached to power windows, in automobiles, and a wire harness using the same.

BACKGROUND OF THE INVENTION

In electrically driven windows such as power windows or electrically-operated sun roofs in automobiles, it is desirable that a safety device be provided which detects any foreign object (such as fingers, etc.) that becomes caught between the window and the window frame, and stops or reverses the motor that drives the window whenever such a foreign object is detected. Means for detecting such foreign objects include indirect-detection means for detecting the torque of the motor which changes when a foreign object becomes caught as described above, and direct-detection means, which detect the presence or absence of foreign objects by sensors installed in the window frame. Indirect-detection means suffer from problems such as a slow response speed; accordingly, Paragraph 118 of the FMVSS (U.S. Federal Motor Vehicle Safety Standards) uses direct-detection means. Piezoelectric cables and tape-form mechanical switches, consisting of a pair electrodes facing each other across a very small gap have been proposed as pressure sensors, which directly detect foreign objects. In the case of mechanical switches, foreign objects which are inserted obliquely between the window and the window frame may fail to be detected in some cases. On the other hand, as disclosed in Japanese Patent Application No. 61-226679, piezoelectric cables have a uniform directionality, and can therefore detect foreign objects without being affected by the angle of insertion. Furthermore, since piezoelectric cables have a coaxial structure, such cables are resistant to electromagnetic interference from the outside.

In regard to actual configurations of wire harnesses, a configuration in which a piezoelectric cable 4 is caused to extend along a window frame 2 of a vehicle door 1, and is further caused to extend from the window frame 2 to a motor control unit 3 accommodated in the lower part of the door 1 or in the vehicle body (not shown) is shown in FIG. 3; or a configuration in which a connector 5 is attached to the end portion of a piezoelectric cable 4' installed along the window frame 2, and the motor control unit 3 and connector 5 are connected to each other by a separate wire harness 8 which has connectors 6 and 7 installed at both ends is shown in FIG. 4.

However, in the case shown in FIG. 3, unwanted signals caused by vibration of the vehicle, may be picked up if there is any slack in the piezoelectric cable 4 in the lower part of the door 1. Although the problem of such signals can be solved by firmly fastening the piezoelectric cable so that slack is completely eliminated, such fastening of the cable 4 will result in additional cost.

Furthermore, in the case shown in FIG. 4, although no unwanted signals will be picked up in areas other than the window frame 2 where the cable 4 is supposed to act as a sensor, the addition of the connectors 6 and 7 results in an increase in the number of connections. This not only lowers the reliability of the connection, but also leads to an increase in parts and assembly costs as a result of the additional harness 8.

SUMMARY OF THE INVENTION

Accordingly, the object of the present invention is to provide a low-cost piezoelectric cable and wire harness using the same, which offer a high connection reliability without picking up unwanted signals in areas other than the areas where the cable is supposed to act as a sensor.

The piezoelectric cable of the present invention comprises a core conductor, a piezoelectric material layer, an outer conductor and an outer covering disposed in a coaxial configuration in that order from the center outward, a piezoelectric region and a non-piezoelectric region are formed adjacent to each other in the direction of length of the piezoelectric cable.

The piezoelectric cable of the present invention includes a core conductor, a piezoelectric material layer, an outer conductor and an outer covering disposed in a coaxial configuration in that order from the center outward, the piezoelectric material layer is formed as a polarized region and a non-polarized region which are adjacent to each other in the direction of length of the piezoelectric cable.

The present invention is directed to a wire harness wherein an electrical connector is attached to an end portion of a non-piezoelectric region or a non-polarized region of a piezoelectric cable.

A piezoelectric cable comprises a center conductor, a layer of material covering the center conductor having a piezoelectric region and a non-piezoelectric region; and an outer conductor covering the layer of material.

A wire harness comprises a piezoelectric cable having a center conductor, a layer of material having a piezoelectric region and a non-piezoelectric region covering the center conductor and an outer conductor extending along the layer of material; and an electrical connector attached to the non-piezoelectric region and having electrical contacts respectively connected to the center conductor and the outer conductor.

BRIEF DESCRIPTION OF THE DRAWINGS

FIG. 3 is a side view of a car door containing a conventional wire harness.

FIG. 4 is a side view of a car door containing another conventional wire harness.

DETAILED DESCRIPTION OF THE INVENTION

Figure 1:
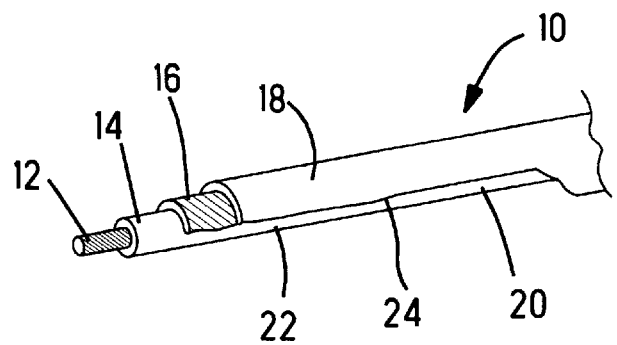
FIG. 1 is a partly-sectioned view of a piezoelectric cable of the present invention.

In FIG. 1, piezoelectric cable 10 is constructed from a core or center conductor 12, a layer of piezoelectric material 14, an outer conductor 16 and an outer dielectric covering 18 which are disposed in a coaxial configuration in that order from the center outward. The materials of these elements are basically the same as in a conventional cable. Specifically, the core conductor 12 comprises a conductive material such as copper. Furthermore, considering heat resistance, a polyvinylidene fluoride (PVDF) copolymer is ideal as the material of the piezoelectric material layer 14. Moreover, the outer conductor 16 is a braided or laterally wound wire comprising a conductive material such as copper, and the outer covering 16 is an insulating material such as a polyvinyl chloride (PVC) or polyurethane.

The piezoelectric cable 10 of the present invention differs from a conventional piezoelectric cable in the following respect: i.e., the cable 10 does not have uniform piezoelectric properties along the entire length of the cable, but instead has a piezoelectric region 20 and a non-piezoelectric region 22 which are adjacent to each other in the direction of the length of the cable. Specifically, the piezoelectric region 20 and non-piezoelectric region 22 are adjacent to each other, with an intermediate section 24 (indicated by a broken line in FIG. 1) as a boundary. Accordingly, when pressure or an impact is applied to the piezoelectric region 20, a pulse voltage is generated between the core conductor 12 and the outer conductor 16; however, no pulse voltage is generated when pressure is applied to the non-piezoelectric region 22.

In order to obtain a piezoelectric cable 10 which has such characteristics, a strong electric field is applied only to that portion of the piezoelectric material layer 14 in which piezoelectric properties are required, i.e., only to the desired piezoelectric region 20, so that only the piezoelectric material 14 in this piezoelectric region is caused to undergo polarization. Furthermore, since it is difficult to polarize the piezoelectric region 20 of the piezoelectric cable 10 following the completion of the cable, the piezoelectric material layer 14 in the piezoelectric region 20 is polarized prior to the process in which the outer conductor 16 is formed on top of the piezoelectric material layer 14. Moreover, since the separate polarization of the piezoelectric material layers 14 of a plurality of piezoelectric cables 10 having a prescribed length is extremely inefficient, it is advisable to use a process in which a single continuous piezoelectric material layer 14 with a core conductor 12 in the center is intermittently polarized at prescribed intervals, after which this piezoelectric material layer 14 is covered with an outer conductor 16 and outer covering 18 to form a single piezoelectric cable, which is subsequently cut at prescribed positions. In this case, it is convenient for subsequent processing to place marks on the outer covering 18 corresponding to the regions of the polarized piezoelectric material and the regions of the non-polarized piezoelectric material.

Figure 2:
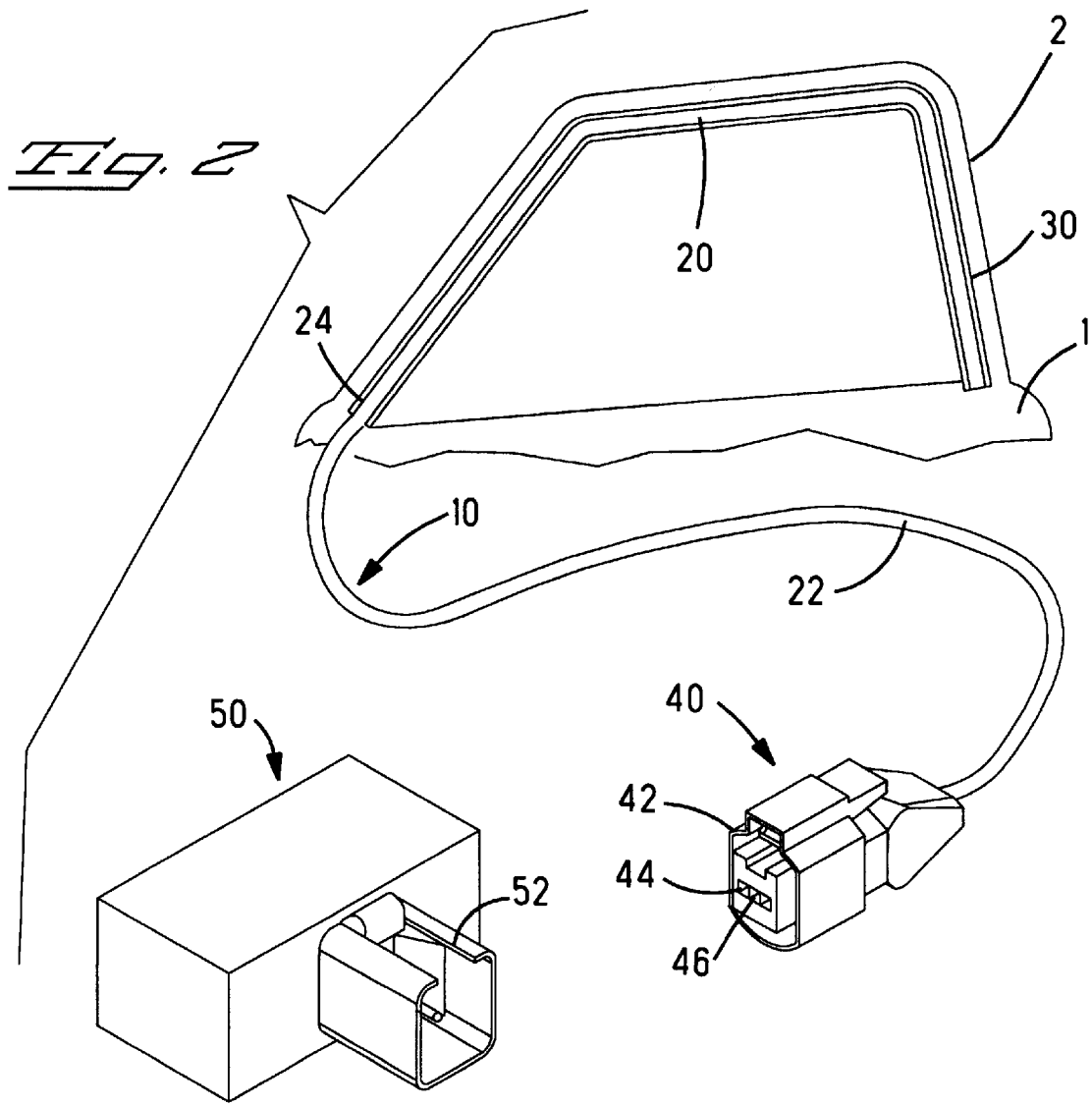
FIG. 2 is a perspective view showing a wire harness of the present invention.

In FIG. 2, wire harness 30 includes a piezoelectric cable 10 in which a piezoelectric region 20 and a non-piezoelectric region 22 form adjacent sections of each other, and an electrical connector 40 which is connected to one end of the non-piezoelectric region 22. The electrical connector 40 is a universally-known connector comprising an insulating housing 42 which has two contact-accommodating compartments 44 and 46, and two contacts (not shown). The two contacts are respectively connected to the core conductor 12 and the outer conductor 16 of the piezoelectric cable 10. Furthermore, the electrical connector 40 could also be a universally known coaxial connector or shield connector, or a connector containing circuitry such as an impedance converter circuit, amplifier circuit, comparator circuit and A/D converter circuit for processing signals from the piezoelectric cable 10. In cases where a connector containing such circuitry is used, the circuitry in control box or unit 50 described below may be simplified and reduced in size. The control box 50 accommodated in the lower portion of the vehicle door 1 or in the vehicle body processes signals from the piezoelectric cable 10, and sends signals to a motor (not shown) which opens and closes the window. Control box 50 has an electrical connector 52 which mates with the electrical connector 40. As was described above, the core conductor 12 and outer conductor 16 of the piezoelectric cable 10 have a coaxial structure along the entire length of the coaxial cable 10; accordingly, the coaxial cable 10 tends not to be affected by external electromagnetic interference. In addition, since the portion of the piezoelectric cable 10, which is not supposed to act as a sensor as it is of a non-piezoelectric or non-polarized region 22, there is no generation of false signals in this region. Furthermore, when the piezoelectric cable 10 is attached along the window frame 2, it is necessary to install a weather strip 30 made of rubber or the like around the periphery of at least the piezoelectric or polarized region 20 in order to prevent water, etc., from entering the interior of the cable 10.

A preferred embodiment of the present invention has been described above. However, the present invention is not limited to such embodiment described above; it therefore goes without saying that various modifications and alterations may be made as required. For example, in cases where two locations where detection is desired are separated from each other, it is desirable to use a single piezoelectric cable in which two piezoelectric or polarized regions and two non-piezoelectric or non-polarized regions are alternately disposed along the axial direction of the cable. Furthermore, the field of application of the piezoelectric cable and wire harness of the present invention is not limited to electrically-driven windows in automobiles; the present invention can be applied to all fields in which sensor parts and control parts are separated from each other. For example, the present invention can be applied to sensors which detect the passage of vehicles using sensor parts embedded in the roadway (traffic sensors), sensors which are contained in the floor mats of automatic doors and which detect the presence or absence of persons or objects, and sensors which are contained in the mattresses of beds used for medical treatment, and which detect the presence or absence of a patient.

In the present invention, piezoelectric or polarized regions and non-piezoelectric or non-polarized regions are formed adjacent each other along a piezoelectric cable which has a coaxial structure. Accordingly, the following advantages are obtained: i.e., not only is the cable resistant to electromagnetic interference from the outside, but noise caused by vibration, etc., is not picked up in the regions which are not supposed to act as sensors. Furthermore, since a single piezoelectric cable is used, a high connection reliability is obtained, and production costs can be kept low.

We claim:

1. A coaxial piezoelectric cable for use in electrically driven windows for detecting foreign objects caught between the window and a frame comprising
    a center conductor,
    a layer of piezoelectric material covering the center conductor having a polarized region and a non-polarized region adjacent to one another, said polarized region extending along said frame for sensing foreign objects, said non-polarized region non-responsive to sensing foreign objects;
    an outer conductor covering the layer of piezoelectric material, and
    an outer covering extending along said outer conductor.

2. A piezoelectric cable as claimed in claim 1, wherein an intermediate region is disposed between said polarized region and said non-polarized region.

3. A piezoelectric cable as claimed in claim 1, wherein an electrical connector having a first electrical contact is connected to said center conductor and a second electrical contact is connected to the outer conductor at an end corresponding to said non-polarized region thereby defining a wire harness.

4. A wire harness comprising
    a piezoelectric cable having a center conductor, a unitary piezoelectric layer of material having a polarized region and a non-polarized region covering the center conductor, an outer conductor extending along the layer of material and an outer covering extending along said outer conductor, said piezoelectric cable disposed within an automobile door having a window frame portion and a body portion, wherein said polarized region extends along the window frame and said non-polarized region extends along the body portion; and an electrical connector attached to the non-polarized region and having electrical contacts respectively connected to the center conductor and the outer conductor.

5. A wire harness as claimed in claim 4, wherein the polarized region is adjacent to said non-polarized region with an intermediate section disposed between the polarized region and the non-polarized region.

* * * * *